(12) United States Patent
Yamane et al.

(10) Patent No.: US 7,501,902 B2
(45) Date of Patent: *Mar. 10, 2009

(54) PHASE-LOCKED LOOP CIRCUIT AND DATA REPRODUCTION APPARATUS

(75) Inventors: Shinichi Yamane, Settsu (JP); Seiji Watanabe, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/805,556

(22) Filed: May 23, 2007

(65) Prior Publication Data

US 2007/0279134 A1 Dec. 6, 2007

Related U.S. Application Data

(63) Continuation of application No. 11/375,814, filed on Mar. 15, 2006, now Pat. No. 7,362,186, which is a continuation of application No. 10/881,883, filed on Jun. 30, 2004, now Pat. No. 7,034,622, which is a continuation of application No. 10/197,021, filed on Jul. 17, 2002, now Pat. No. 6,828,865.

(30) Foreign Application Priority Data

Jul. 19, 2001 (JP) ............................. 2001-218990

(51) Int. Cl.
*H03L 7/00* (2006.01)
(52) U.S. Cl. .............................. 331/25; 327/24; 327/157
(58) Field of Classification Search ........................ None
See application file for complete search history.

(56) References Cited

U.S. PATENT DOCUMENTS 4,851,909 A 7/1989 Noske et al.

(Continued)

FOREIGN PATENT DOCUMENTS

JP 59-033950 2/1984

OTHER PUBLICATIONS

United States District Court For The Eastern District of Texas, Marshall Division, Civil Action No. 2-05CV-484, Document No. 1-1 filed Oct. 17, 2005, Jury Trial Demanded, Plaintiff Mediatek, Inc.'s Complaint For Patent Infringement, 6 pages.

(Continued)

*Primary Examiner*—Cassandra Cox
(74) *Attorney, Agent, or Firm*—Marjama Muldoon Blasiak & Sullivan LLP

(57) ABSTRACT

This invention relates to a phase-locked loop circuit and a data reproduction apparatus, which can reduce a processing time that is required for initial adjustment in the data reproduction apparatus. In a digital data reproduction apparatus having two control functions, i.e., phase and duty adjustments for binarized data, the phase comparison with one edge is performed only at the phase adjustment by means of a phase-locked loop circuit 33 having an edge switching means 4 which controls the phase comparator 1. The phase comparator 1 inputs the binarized and a bit synchronous clock, and switches the output between a comparison result with one edge, i.e., a rising edge or a falling edge of binarized data, and a comparison result with both edges.

17 Claims, 6 Drawing Sheets

U.S. PATENT DOCUMENTS

| | | | |
|---|---|---|---|
| 4,852,126 | A | 7/1989 | Tanaka et al. |
| 5,157,277 | A | 10/1992 | Tran et al. |
| 5,432,481 | A | 7/1995 | Saito et al. |
| 5,729,179 | A | 3/1998 | Sumi et al. |
| 5,940,070 | A | 8/1999 | Koo et al. |
| 6,060,953 | A | 5/2000 | Tsai |
| 6,072,370 | A | 6/2000 | Nakamura et al. |
| 6,147,530 | A | 11/2000 | Nogawa et al. |
| 6,166,606 | A | 12/2000 | Tsyrganovich |
| 6,211,741 | B1 | 4/2001 | Dalmia |
| 6,275,072 | B1 | 8/2001 | Dally et al. |
| 6,285,726 | B1 | 9/2001 | Gaudet |
| 6,320,921 | B1 | 11/2001 | Gu |
| 6,498,537 | B1 | 12/2002 | Watanabe et al. |
| 6,501,311 | B2 | 12/2002 | Lutkemeyer |
| 6,563,888 | B1 | 5/2003 | Toriyama et al. |
| 6,631,103 | B1 | 10/2003 | Yamanoi et al. |
| 6,667,663 | B2 | 12/2003 | Ozawa et al. |
| 6,828,865 | B2 | 12/2004 | Yamane et al. |
| 6,952,462 | B2 * | 10/2005 | Harrison ............... 375/373 |
| 6,959,061 | B1 | 10/2005 | Kuwata et al. |
| 7,034,622 | B2 | 4/2006 | Yamane et al. |
| 2003/0032392 | A1 | 2/2003 | Suzuki |
| 2003/0072222 | A1 | 4/2003 | Sekine et al. |
| 2006/0176089 | A1 | 8/2006 | Yamane et al. |

OTHER PUBLICATIONS

United States District Court For The Eastern District of Teexas, Marshall Division, Civil Action No. 2-05CV-484TJW, Document 13-1, filed Feb. 1, 2006, Jury Demanded, Matsushita Electric Industrial Co., Ltd. and Panasonic Corporation of North America's Answer and Counter Claims, 12 pages.

United States District Court For The Eastern District of Texas, Marshall Division, Civil Action No. 2-05-CV-484TJW, Document No. 18 filed Feb. 21, 2006, Jury Trial Demanded, Plaintiff and Counterclaim Defendant Mediatek, Inc.'s Reply to Counterclaims for Patent Infringement of U. S. Patent No. 6,828,865 and U. S. Patent No. 5,347,232 and for Declaratory Judgment of Invalidity and Non-Infringement, 11 pages.

United States District Court For The Eastern District of Texas, Marshall Division, Civil Action No. 2-05-CV-484TJW, Document 19 filed Feb. 21, 2006, Jury Trial Demanded, Counterclaim Defendant MSI Computer Corp.'s Reply to Counterclaims for Patent Infringement of U. S. Patent No. 6,828,865 and U. S. Patent No. 5,347,232, 8 pages.

United States District Court For The Eastern District of Texas, Marshall Division, Civil Action No. 2-05-CV-484TJW, Document 20, filed Feb. 21, 2006, Jury Trial Demanded, Counterclaim Defendant Oppo Digital, Inc.'s Reply to Counterclaims for Patent Infringement of U. S. Patent No. 6,828,865 and U. S. Patent No. 5,347,232, 8 pages.

* cited by examiner

PHASE-LOCKED LOOP CIRCUIT AND DATA REPRODUCTION APPARATUS

CROSS REFERENCE TO RELATED APPLICATIONS

This application is a continuation of U.S. patent application Ser. No. 11/375,814, filed Mar. 15, 2006 (now U.S. Patent Publication No. 2006/0176089), which is incorporated herein by reference and which is a continuation of U.S. patent application Ser. No. 10/881,883, filed Jun. 30, 2004 (now U.S. Pat. No. 7,034,622) which is a continuation of U.S. patent application Ser. No. 10/197,021, filed Jul. 17, 2002, (now U.S. Pat. No. 6,828,865), which is incorporated herein by reference and which claims the benefit of priority of Japanese Patent Application No. 2001-218990. The benefit of priority of each of the above applications is claimed.

FIELD OF THE INVENTION

The present invention relates to a phase-locked loop circuit (PLL) for digital signals and a control method for a data reproduction apparatus, and more particularly, to a phase-locked loop circuit and a data reproduction apparatus having such a structure that can adjust a slice level of a comparator and a phase of a PLL independently.

BACKGROUND OF THE INVENTION

Generally, a circuit for reproducing digital data from an optical disc binarizes a signal from the disc by means of a comparator, and then generates a bit synchronous clock by means of a phase-locked loop circuit (hereinafter, referred to as PLL). In order to reduce a phase shift between the data signal and the bit synchronous clock, which is here called jitter, this reproduction circuit has a circuit for adjusting a slice level of the comparator and a phase of the PLL in an earlier time by a jitter detection means or the like. However, these adjustments for the slice level of the comparator and the phase of the PLL cannot be performed independently, without being affected with each other.

FIG. 5 is a diagram showing an example of a data reproduction apparatus having such construction. The conventional data reproduction apparatus shown in FIG. 5 includes a comparator 31, a PLL 35 that receives an output (data) from the comparator 31, and a phase shift detection means 34. The comparator 31 is provided with a slice level adjustment circuit 32. The PLL 35 includes a phase comparator 1, a phase adjustment circuit 5, a charge pump 2, and a voltage controlled oscillator (hereinafter, referred to also as a VCO) 3.

Hereinafter, an operation of the data reproduction apparatus will be described.

The comparator 31 receives a signal RF from a recording medium such as an optical disc, and binarizes the signal RF to output a binarized signal to the PLL 35 in the latter stage. Here, the slice level that is to be a threshold for the comparator 31 is adjusted by the slice level adjustment circuit 32 so as to minimize the amount of jitter (the phase shift between the data signal and the bit synchronous clock), in view of the amount of phase difference between the comparator output (data) and a phase-locked clock CLK.

The PLL 35 generates a clock CLK from the binarized signal (data) that is outputted from the comparator 31, and outputs the generated clock CLK. Here, the phases of the phase-locked clock CLK that is outputted from the VCO 3 and the data from the comparator 31 are compared with each other, and a control voltage for the VCO 3 is decided by means of the charge pump 2, and fed back to lock the phase.

The phase adjustment circuit 5 controls the amount of current in the charge pump 2 to prevent a phase difference from occurring when an inclination of a rising edge and an inclination of a falling edge of a PLL-generated clock become different from each other due to the difference in the amount of current between a PMOS transistor and a NMOS transistor constituting the charge pump 2. The amount of current is adjusted, for example, by measuring the amount of jitter to minimize the same.

FIG. 6 is a timing chart of the conventional data reproduction apparatus having the above-mentioned structure.

In order to increase the frequency of the phase comparison and improve the accuracy in the phase locking, the phase comparator 1 that constitutes the PLL 35 detects both of rising and falling edges of the data, and compares the respective edges with one edge (rising or falling edge) of the clock CLK. In the aforementioned structure in which the PLL 35 always performs the phase adjustment with the output from the comparator 31 whose slice level has been adjusted, the timing of the falling of the data changes according to duty variations resulting from the slice level adjustment for the data that is outputted from the comparator 31 as shown in FIG. 6, and accordingly the PLL is unfavorably locked so that the phase of a rising edge is also shifted. Thus, it is required to adjust the phase of the data every time when the slice level is adjusted. That is, the phase adjustment for the data cannot be performed before the adjustment of the slice level.

Further, in a state where neither the duty nor the phase is adjusted, it cannot be decided whether the phase shift between the data and the CLK is caused by the phase of the data or the duty. Therefore, it is impossible to perform only the duty correction according to the slice level adjustment, before performing the phase adjustment.

To be more specific, in cases of employing the phase comparator that performs the detection of both edges, it is impossible to perform one of the slice level adjustment and the phase adjustment independently in advance. Therefore, according to the prior art, the optimum slice level and phase must be decided on the basis of all combinations as to the two adjustment patterns.

When there are X possible increments in the slice level adjustment and Y possible increments in the phase adjustment, there are X*Y possible adjustment patterns in the entire data reproduction apparatus. For example when X and Y are 8 bits, i.e., there are 256 increments, respectively, there are 65,536 increments on the whole, and thus the processing time required for the adjustment becomes quite long. The initial adjustment including the jitter correcting control in this data reproduction apparatus is performed at each start of a disc, while it comes to be more difficult to increase the efficiency in the whole apparatus including other functional blocks, as the rotation speed of the optical disc is particularly increased.

Since the conventional phase-locked loop circuit and the control method for the data reproduction apparatus are constructed as described above, and the locking operation in the PLL varies depending on different slice levels of the comparator, the adjustment of the slice level and the phase of the PLL cannot be performed independently without being affected with each other, whereby the time required for the initial adjustment in the data reproduction apparatus cannot be reduced.

SUMMARY OF THE INVENTION

The present invention has for its object to provide a phase-locked loop circuit and a data reproduction apparatus, which can reduce a processing time that is required for initial adjustment in the data reproduction apparatus.

Other objects and advantages of the present invention will become apparent from the detailed description and specific embodiments described are provided only for illustration since various additions and modifications within the spirit and scope of the invention will be apparent to those of skill in the art from the detailed description.

According to a 1st aspect of the present invention, there is provided a phase-locked loop circuit comprising: a phase comparator for comparing phases of both rising and falling edges of binarized data with a phase of a bit synchronous clock; a charge pump for generating a control voltage from an output of the phase comparator; a voltage controlled oscillator for generating the bit synchronous clock from an output of the charge pump; and an edge switching means for controlling the phase comparator to perform switching between a comparison result as to only the rising or falling edge of the binarized data and a comparison result as to both of the edges, in the phase comparison between the binarized data and the bit synchronous clock by the phase comparator, and to output a selected result. Therefore, when this phase-locked loop circuit is incorporated into a data reproduction apparatus, an edge to be compared by the phase comparator can be changed, thereby adjusting the duty of the data signal without affecting a phase shift between the data signal and the bit synchronous clock, and further only the phase shift can be adjusted without depending on the duty.

According to a 2nd aspect of the present invention, in the phase-locked loop circuit of the 1st aspect, the phase comparator comprises: a first phase comparator for detecting the falling edge of the binarized data; and a second phase comparator for detecting the rising edge of the binarized data, and the edge switching means performs the phase comparison as to the both edges of the binarized data by using an OR of the results from the two phase comparators, and performs the phase comparison as to one of the edges by selecting one of the outputs from the two phase comparators and outputting the selected output. Therefore, when this phase-locked loop circuit is incorporated into a data reproduction apparatus, an edge to be compared by the phase comparator can be changed, thereby adjusting the duty of the data signal without affecting a phase shift between the data signal and the bit synchronous clock. Further, the adjustment of only the phase shift without depending on the duty can be realized by a simple construction and without requiring large circuit modification.

According to a 3rd aspect of the present invention, in the phase-locked loop circuit of the 1st aspect, the phase comparator comprises: a first phase comparator for detecting the falling edge of the binarized data; and a second phase comparator for detecting the rising edge of the binarized data, and the edge switching means performs the phase comparison as to the both edges of the binarized data by using an OR of outputs from the two phase comparators, and performs the phase comparison as to only one edge by fixing an output of one of the two phase comparators by means of a reset signal. Therefore, when this phase-locked loop circuit is incorporated into a data reproduction apparatus, an edge to be compared by the phase comparator can be changed, thereby adjusting the duty of the data signal without affecting a phase shift between the data signal and the bit synchronous clock. Further, the adjustment of only the phase shift without depending on the duty can be realized by a simpler construction and without requiring large circuit modification.

According to a 4th aspect of the present invention, there is provided a data reproduction apparatus including: a comparator for binarizing a reproduction signal from a disc to generate a data signal, a slice level adjustment circuit for adjusting a slice level of the comparator to correct a duty of the data signal, a phase-locked loop circuit comprising: a phase comparator for comparing phases of both rising and falling edges of the binarized data with a phase of a bit synchronous clock; a charge pump for generating a control voltage from an output of the phase comparator; a voltage controlled oscillator for generating the bit synchronous clock from an output of the charge pump; and an edge switching means for controlling the phase comparator to perform switching between a comparison result as to only the rising or falling edge of the binarized data and a comparison result as to both of the edges, in the phase comparison between the binarized data and the bit synchronous clock by the phase comparator, and to output a selected result, a phase adjustment circuit for controlling the charge pump included in the phase-locked loop circuit to correct the phase, and a phase shift detection means for controlling the duty correction and the phase correction. Therefore, the duty of the data signal can be adjusted without affecting a phase shift between the data signal and the bit synchronous clock, and further only the phase shift can be adjusted without depending on the duty.

According to a 5th aspect of the present invention, in the data reproduction apparatus of the 4th aspect, when there are X kinds of phase adjustment values and Y kinds of slice level adjustment values, one of the X kinds of phase adjustment values which minimizes a phase shift is selected, and thereafter one of the Y kinds of slice level adjustment values which optimizes the duty is selected. Therefore, the phase comparison as to one edge is performed only at the phase adjustment of the data reproduction apparatus, thereby reducing a processing time that is required for the control.

DETAILED DESCRIPTION OF THE INVENTION

Embodiment 1

Hereinafter, a phase-locked loop circuit and a control method for a data reproduction apparatus according to a first embodiment of the present invention will be described with reference to the drawings.

Figure 1:
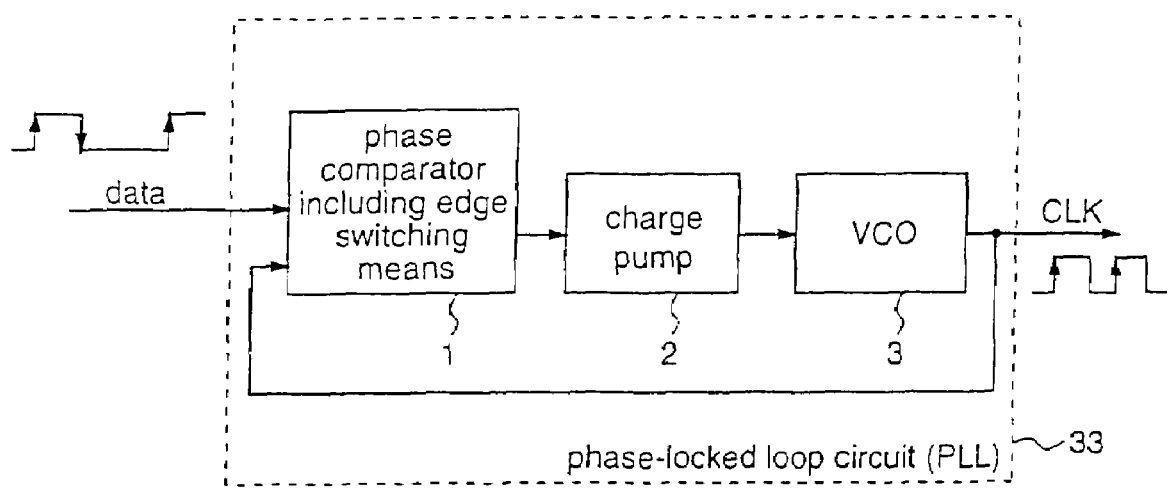
FIG. 1 is a block diagram illustrating a conceptual structure of a phase-locked loop circuit (PLL) according to the present invention.

FIG. 1 is a block diagram illustrating a phase-locked loop circuit according to the first embodiment. In FIG. 1, a phase-locked loop circuit 33 includes a phase comparator 1, a charge pump 2, and a voltage controlled oscillator (VCO) 3. The phase comparator 1 is provided with an edge switching means 4. In this figure, a comparator that outputs an input binarized signal (data) is not shown.

The phase comparator 1 compares a phase of a bit synchronous clock CLK that is generated by the VCO 3 and a phase of the input binarized signal (data) with each other. Then, the charge pump 2 outputs a control voltage to the VCO 3 according to the result of the comparison.

The phase comparator 1 can change an edge detected in the input binarized signal (data) by means of the edge switching means 4. That is, the phase comparator 1 can switch the detection timing between a case of detecting only a rising or falling edge of the input binarized signal (data) and a case of detecting both of the edges.

Figure 2:
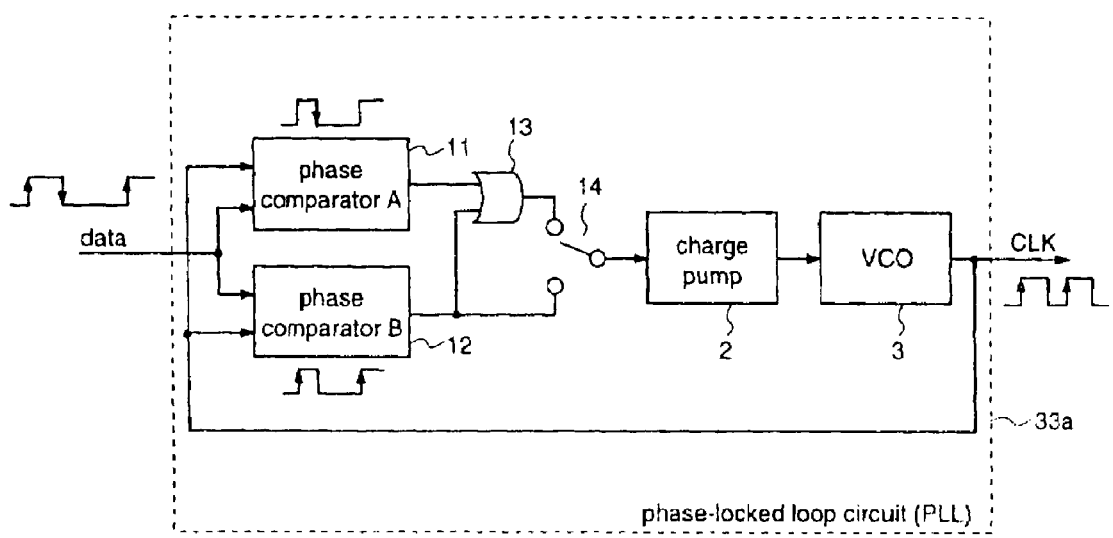
FIG. 2 is a block diagram illustrating a specific structure of a phase-locked loop circuit (PLL) according to a first embodiment of the present invention.

FIG. 2 shows a practical example of the edge switching means 4 and the phase comparator 1. In FIG. 2, a phase-locked loop circuit 33a includes the phase comparator 1 that is constituted by a phase comparator A (11) and a phase comparator B (12), and the edge switching means 4 that is constituted by an OR circuit 13 and a switch 14.

One of the two phase comparators A (11) and B (12) (for example, phase comparator B) performs phase comparison between a rising edge of the data and the bit synchronous clock CLK, while the other comparator (for example, phase comparator A) performs phase comparison between a falling edge of the data and the bit synchronous clock CLK. The results of the two phase comparisons are ORed by the OR circuit 13 of the latter stage, to realize the phase comparison with the both edges of the data. Further, by providing the switch 14, only the result of one of the phase comparators, i.e., the result of the phase comparison with one edge can be selected without being passed through the OR circuit 13.

According to the first embodiment, the two phase comparators 11 and 12 of a type that performs the phase comparison between the falling edge of the input binarized signal (data) and the bit synchronous clock CLK, and a type that performs the phase comparison between the rising edge of the input binarized signal (data) and the bit synchronous clock CLK are provided as the phase comparator 1 that performs comparison between the input binarized signal (data) and the bit synchronous clock (CLK). Further, the OR circuit 13 that obtains an OR of the respective outputs of the comparators, and the switch 14 that switches between the output of the OR circuit 13 and the output of the phase comparator 11 or 12 (here, the phase comparator 12) are provided. Therefore, when the phase adjustment for the PLL is to be performed, the switch 14 is activated so that the edge detection in the phase comparator 1 is performed to select only the rising edge. On the other hand, when the adjustment of the slice level is to be performed, the output of the OR circuit 13 is employed to perform the phase comparisons with the both edges by the phase comparators 11 and 12. In this way, the phase of the PLL and the duty of the comparator can be adjusted independently.

In this first embodiment, the output of the phase comparator B (12) is connected to the switch 14, while the output of the phase comparator A (11) may be connected to the switch 14 so that the edge detection in the phase comparator 1 is performed to select only the falling edge.

Embodiment 2

Figure 3:
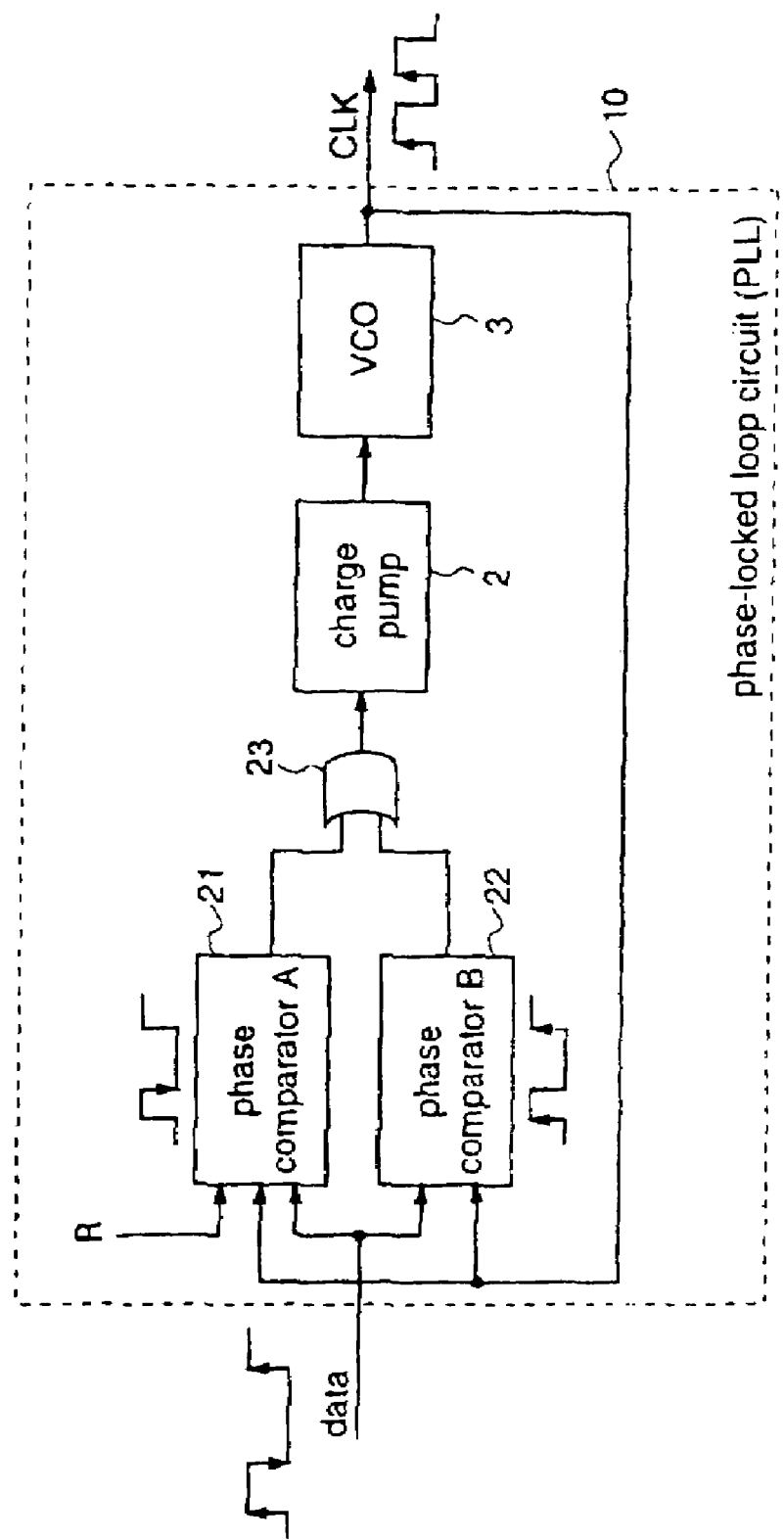
FIG. 3 is a block diagram illustrating a specific structure of a phase-locked loop circuit (PLL) according to a second embodiment of the present invention.

A phase-locked loop circuit according to a second embodiment of the present invention will be described. FIG. 3 is a block diagram illustrating a structure of the phase-locked loop circuit according to the second embodiment. In FIG. 3, the same reference numerals as those in FIG. 2 denote the same or corresponding parts. The phase comparator 1 comprises two phase comparators A (21) and B (22), and these comparators are connected so as to be combined by an OR circuit 23.

One of the two comparators A (21) and B (22) (for example, phase comparator B) performs phase comparison between a rising edge of the input binarized signal (data) and the bit synchronous clock CLK, and the other comparator (for example, phase comparator A) performs phase comparison between a falling edge of the data and the bit synchronous clock CLK.

The OR circuit 23 obtains an OR of the results of the two phase comparators as in the first embodiment, whereby the phase comparators A and B realize the phase comparison with the both edges of the data. In this case, one of the two phase comparators (here, the phase comparator A) is provided with a reset function, and its output is fixed at Low by a reset input R, whereby only the output of the other phase comparator (here, the phase comparator B) is made effective. As a result, the phase comparison with one edge can be selected.

According to the second embodiment, two phase comparators 21 and 22 of a type that performs the phase comparison between the falling edge of the input binarized signal (data) and the bit synchronous clock CLK, and a type that performs the phase comparison between the rising edge of the input binarized signal (data) and the bit synchronous clock CLK are provided as the phase comparator 1 that performs comparison between the input binarized signal (data) and the bit synchronous clock CLK. Further, the OR circuit 23 that obtains an OR of the respective outputs of the comparators is provided, and the reset input R that is provided in the phase comparator 21 is inputted to fix the phase comparator 21 at Low, whereby the outputs from the two phase comparators or the output from one of the phase comparators (phase comparator 22) can be selectively obtained by the OR circuit 23. Therefore, when the phase adjustment for the PLL is to be performed, the reset input R is inputted to perform the edge detection in the phase comparator 1 so that only the rising edge is outputted from the OR circuit 23. On the other hand, when the slice level is to be adjusted, an output of the OR circuit 13 that is an OR of the outputs from the two phase comparators 21 and 22 is employed to perform the phase comparison with the both edges by the phase comparators 21 and 22. Accordingly, the phase of the PLL and the duty of the comparator can be adjusted independently.

In this second embodiment, the output of the phase comparator A (21) is fixed at Low by using a reset input R, while the output of the phase comparator B (22) may be fixed at Low by using a reset input R, whereby the edge detection in the phase comparator 1 is performed so as to select only a falling edge.

Embodiment 3

Figure 4:
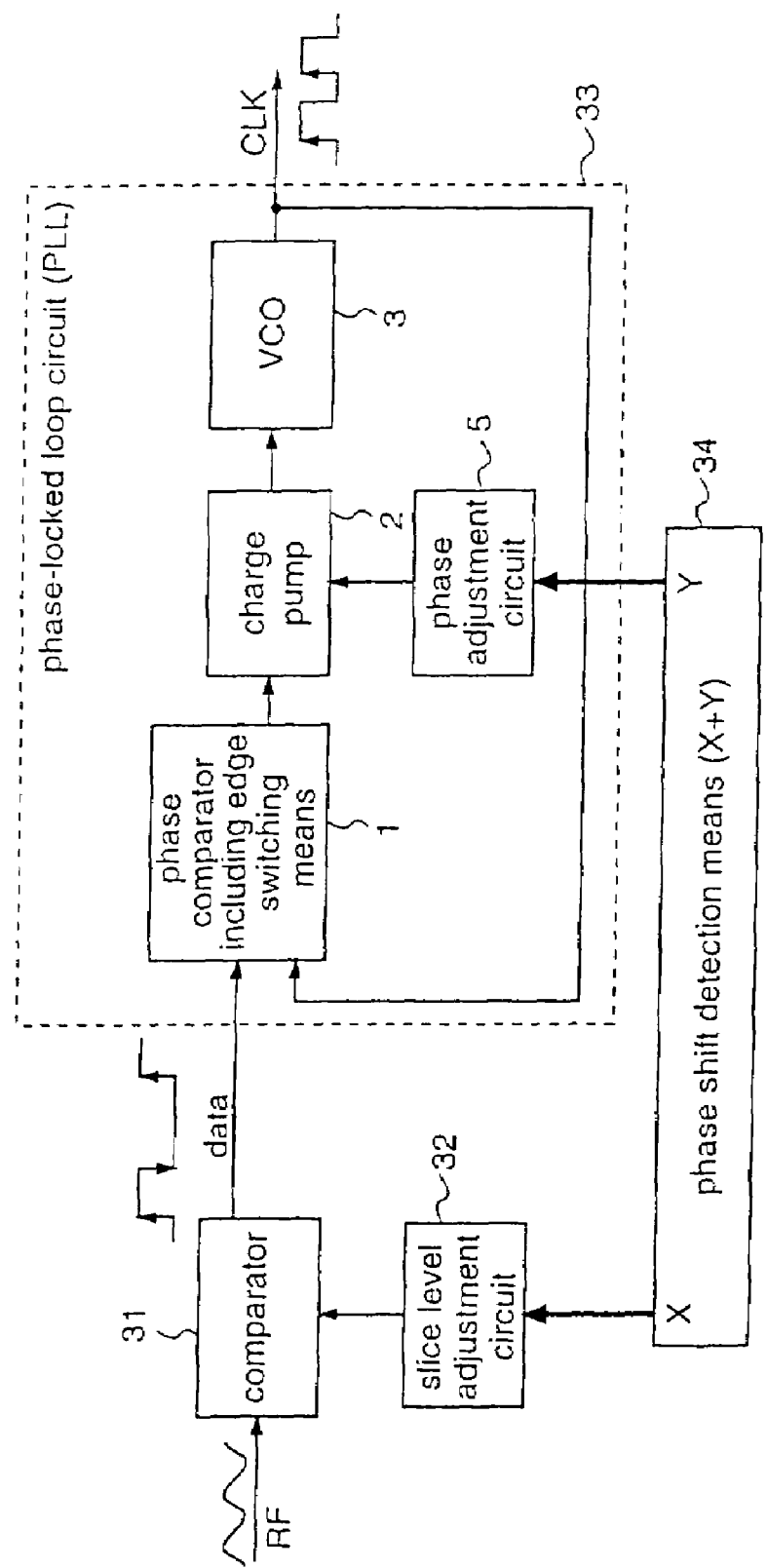
FIG. 4 is a block diagram illustrating a structure of a data reproduction apparatus according to a third embodiment of the present invention.
Figure 5:
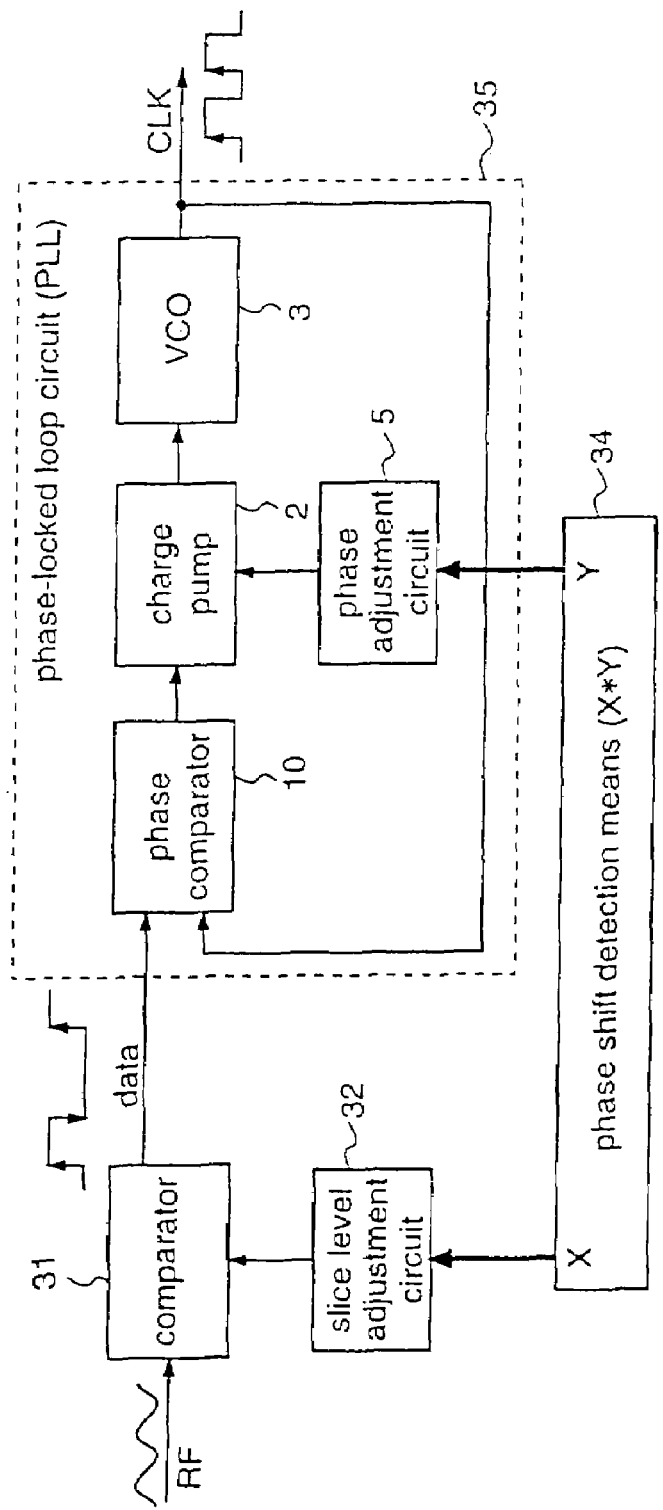
FIG. 5 is a block diagram illustrating a structure of a prior art data reproduction apparatus.

A data reproduction apparatus according to a third embodiment of the present invention will be described. FIG. 4 is a block diagram illustrating a data reproduction apparatus according to the third embodiment. In FIG. 4, the same reference numerals as those in FIG. 1 denote the same or corresponding parts. The data reproduction apparatus includes a comparator 31, a slice level adjustment circuit 32, and a PLL 33. The PLL 33 includes a phase adjustment circuit 5. The adjustments of the slice level and phase are controlled by a phase shift detection means 34.

The comparator 31 receives a signal from a recording medium such as an optical disc, and binarizes the signal to output a binarized signal (data) to the PLL 33. Here, the slice level that is to be a threshold for the comparator 31 is adjusted so as to minimize the amount of jitter, in view of the amount of phase difference between the data and the CLK.

The PLL 33 further has a phase adjustment circuit 5 for adjusting the amount of current in the charge pump 2, because the phase difference in the clock occurs due to the difference in the amount of current between the PMOS and the NMOS in the charge pump 2.

Here, to solve the problem of the prior art, i.e., to eliminate the need for performing the phase adjustment of the data every time when the slice level is adjusted, the edge switching means 4 performs control for performing the phase comparison with one edge of the data only at the phase adjustment in the PLL 33.

Figure 6:
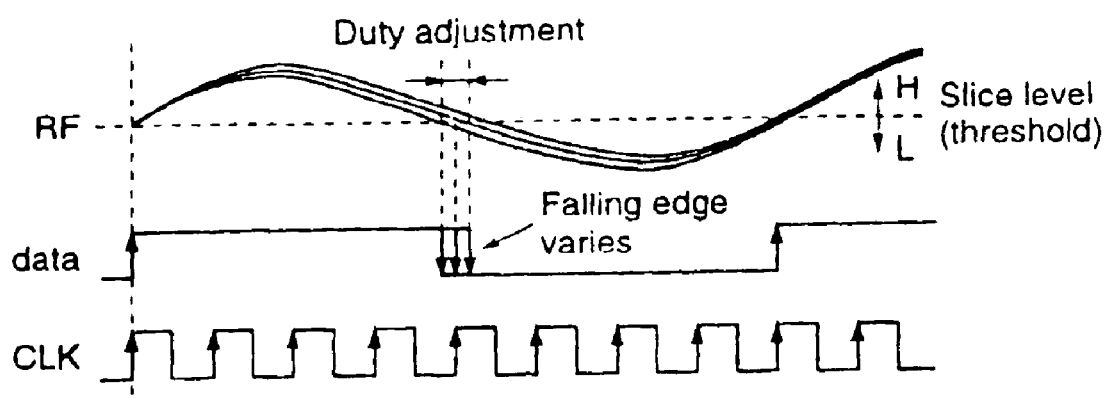
FIG. 6 is a timing chart of the prior art reproduction apparatus.

For example, in the case of the data reproduction apparatus that generates the data and the CLK as shown in the timing chart of FIG. 6, the edge switching means 4 having the structure as shown in the first or second embodiment is employed to control the phase comparator 1 for operating, for example, only with a rising edge of the data only at the phase adjustment in the PLL. Then, after the phase adjustment, the edge switching means 4 performs switching to the phase comparison with the both edges of the data, thereby to adjust the slice level. By doing so, the phase and the duty can be corrected independently and successively, and accordingly the rising edge and the falling edge can be decided successively.

As described above, when the data reproduction apparatus has the structure in which the phase adjustment is not affected by the slice level adjustment, even in a case where there are 256 possible slice level adjustment values and 256 possible phase adjustment values, the entire adjustment in the data reproduction apparatus can be completed only by 256+256=512 times of measurement. This processing can be carried out for a time that is shorter than one hundredth of the processing time in the prior art where optimum two adjusted values can be detected only by performing jitter measurement on the basis of all combinations as to adjustment patterns so that 65,536 times of the measurement are required.

According to the third embodiment, the phase comparator 1 is constructed to perform the phase comparison between a rising edge, a falling edge, or both of the edges of the input binarized signal (data), and the bit synchronous clock CLK, and the edge switching means 4 controls the phase comparator 1 for operating only with a rising edge or a falling edge of the data to perform the phase adjustment of the PLL, and the edge switching means 4 performs switching to the phase comparison with the both edges of the data after the phase adjustment, to adjust the slice level of the comparator 31 by using the slice level adjustment circuit 32. Therefore, the slice level adjustment for the comparator 31 and the phase adjustment for the PLL 33 can be performed separately and independently, whereby the processing time required for the initial adjustment in the data reproduction apparatus can be reduced.

We claim:

1. A phase-locked loop circuit comprising:
    a phase comparator operable to compare phases of both rising and falling edges of binarized data with a phase of a bit synchronous clock, and operable to output, at least, a comparison result as to both of the rising and falling edges and a comparison result as to only the rising or falling edge;
    a switch operable to output the comparison result by switching between outputs of the phase comparator; and
    a voltage controlled oscillator operable to generate the bit synchronous clock based on the output of the switch.

2. The phase-locked loop circuit of claim 1, wherein the binarized data is a signal from an optical disc.

3. A phase-locked loop circuit comprising:
    a phase comparator operable to compare phases of both rising and falling edges of binarized data with a phase of a bit synchronous clock, and operable to output, at least, a comparison result as to both of the rising and falling edges and a comparison result as to only the rising or falling edge;
    a switch operable to output the comparison result by switching between outputs of the phase comparator;
    a charge pump operable to generate a control voltage from the output of the switch; and
    a voltage controlled oscillator operable to generate the bit synchronous clock based on the output of the charge pump.

4. A phase-locked loop circuit comprising:
    a phase comparator including edge switching means operable to compare phases between both edges of a binarized data and a bit synchronous clock and at least one of phases between a rising edge of the binarized data and the bit synchronous clock and phases between a falling edge of the binarized data and the bit synchronous clock, and output a comparison result by switching between the comparison results; and
    a voltage controlled oscillator operable to generate the bit synchronous clock based on the output of the phase comparator including edge switching means.

5. The phase-locked loop circuit of claim 4, further comprising:
    a charge pump operable to generate a control voltage from the output of the phase comparator including edge switching means;
    wherein the voltage controlled oscillator is operable to generate the bit synchronous clock based on the output of the charge pump.

6. The phase-locked loop circuit of claim 5, further comprising: a phase adjustment circuit for adjusting the amount of current in the charge pump.

7. The phase-locked loop circuit of claim 4, wherein the phase comparator including edge switching means includes two phase comparators that are a first phase comparator operable to compare phases between the rising edge of the binarized data and the bit synchronous clock and a second phase comparator operable to compare phases between the falling edge of the binarized data and the bit synchronous clock.

8. The phase-locked loop circuit of claim 7, wherein the phase comparator including edge switching means includes an OR circuit operable to output the comparison result between both edges of the binarized data and the bit synchronous clock based on the two outputs of the phase comparators.

9. The phase-locked loop circuit of claim 4, wherein the phase comparator including edge switching means sequentially outputs the comparison result of both edges and the comparison result of the rising or falling edge in time sequentially.

10. The phase-locked loop circuit of claim 9, wherein the phase comparator including edge switching means outputs the comparison result of both edges, after outputting the comparison result of the rising or falling edge.

11. The phase-locked loop circuit of claim 4, wherein the binarized data is a signal from a recording medium.

12. The phase-locked loop circuit of claim 4, wherein the binarized data is a signal from an optical disc.

13. A data reproduction apparatus comprising:
   a comparator operable to binarize a reproduction signal from a recording medium;
   a slice level adjustment circuit operable to adjust a slice level of the comparator;
   a phase comparator including edge switching means operable to compare phases between both edges of a binarized data and a bit synchronous clock and at least one of phases between a rising edge of the binarized data and the bit synchronous clock and phases between a falling edge of the binarized data and the bit synchronous clock, and output a comparison result by switching between the comparison results; and
   a voltage controlled oscillator operable to generate the bit synchronous clock based on the output of the phase comparator including edge switching means.

14. The data reproduction apparatus of claim 13 wherein the adjustment for the slice level results from a phase comparison using both edges.

15. The data reproduction apparatus of claim 13 wherein the adjustment for the phase of the data results from a phase comparison using the rising or falling edge.

16. The data reproduction apparatus of claim 13 wherein the adjustment for the slice level results from a phase comparison using both edges, and wherein the adjustment for the phase of the data results from a phase comparison of the rising or falling edge.

17. The data reproduction apparatus of claim 13 wherein the recording medium is an optical disc.

* * * * *